United States Patent
Kawazu (10) Patent No.: US 10,068,818 B2
(45) Date of Patent: Sep. 4, 2018

(54) SEMICONDUCTOR ELEMENT PACKAGE, SEMICONDUCTOR DEVICE, AND MOUNTING STRUCTURE

(71) Applicant: KYOCERA Corporation, Kyoto-shi, Kyoto (JP)

(72) Inventor: Yoshiki Kawazu, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/573,762

(22) PCT Filed: May 18, 2016

(86) PCT No.: PCT/JP2016/064728
§ 371 (c)(1),
(2) Date: Nov. 13, 2017

(87) PCT Pub. No.: WO2016/186128
PCT Pub. Date: Nov. 24, 2016

(65) Prior Publication Data
US 2018/0130718 A1   May 10, 2018

(30) Foreign Application Priority Data
May 20, 2015 (JP) .................. 2015-102705

(51) Int. Cl.
*H01L 23/00* (2006.01)
*H01L 23/047* (2006.01)
(Continued)

(52) U.S. Cl.
CPC .......... *H01L 23/057* (2013.01); *H01L 23/043* (2013.01); *H01L 23/12* (2013.01);
(Continued)

(58) Field of Classification Search
CPC ..... H01L 23/043; H01L 23/057; H01L 23/12; H01L 23/373; H01L 23/48; H01L 23/498;
(Continued)

(56) References Cited

U.S. PATENT DOCUMENTS 6,220,765 B1* 4/2001 Tatoh .................. H01L 31/0203
257/E31.117
6,365,961 B1* 4/2002 Tomie ..................... H01L 23/66
257/664

(Continued)

FOREIGN PATENT DOCUMENTS

JP  11-214556 A  8/1999
JP  2009-177041 A  8/2009

(Continued)

OTHER PUBLICATIONS

International Search Report, PCT/JP2016/064728, dated Jul. 19, 2016, 4 pgs.

*Primary Examiner* — Dao H Nguyen
(74) *Attorney, Agent, or Firm* — Volpe and Koenig, P.C.

(57) ABSTRACT

A semiconductor element package includes a base body, a frame member, and a terminal member. The frame member is provided on a main surface of the base body. A notch is formed on the base body side of this frame member. The notch is a gap between the one main surface of the base body and the frame member. The terminal member is provided so as to cover the notch as the gap. The terminal member includes a first dielectric layer, a plurality of signal wiring conductors and a plurality of coplanar ground conductor layers that are provided on one surface of the first dielectric layer, and a second dielectric layer. The first dielectric layer has a hole provided open in a region of the one surface between a first wiring conductor and a second wiring conductor.

8 Claims, 9 Drawing Sheets

(51) Int. Cl.
*H01S 5/022* (2006.01)
*H05K 7/02* (2006.01)
*H01L 23/057* (2006.01)
*H01L 23/12* (2006.01)
*H01L 31/0203* (2014.01)
*H01L 23/373* (2006.01)
*H05K 7/00* (2006.01)
*H01L 23/498* (2006.01)
*H01L 23/043* (2006.01)
*H05K 7/18* (2006.01)
*H01L 23/48* (2006.01)
*H05K 5/02* (2006.01)
*H05K 5/00* (2006.01)

(52) U.S. Cl.
CPC ............ *H01L 23/373* (2013.01); *H01L 23/48* (2013.01); *H01L 23/498* (2013.01); *H01L 31/0203* (2013.01); *H01S 5/02284* (2013.01); *H05K 5/00* (2013.01); *H05K 5/02* (2013.01); *H05K 7/00* (2013.01); *H05K 7/02* (2013.01); *H05K 7/18* (2013.01)

(58) Field of Classification Search
CPC ... H01L 31/0203; H01S 5/02284; H05K 5/00; H05K 5/02; H05K 7/00; H05K 7/02; H05K 7/18

USPC ............... 257/659, 664, 690, 728, 737, 787, 257/E23.026, E23.066, E23.068, E23.114, 257/E23.136, E23.185, E23.19, E25.012, 257/E21.502, E21.504; 174/387, 388; 361/301.3, 679.01, 712, 749, 752, 807; 438/108, 122, 123

See application file for complete search history.

(56) References Cited

U.S. PATENT DOCUMENTS

| | | | |
|---|---|---|---|
| 2004/0184239 A1* | 9/2004 | Zimmerman | H01L 21/50 361/712 |
| 2005/0207092 A1* | 9/2005 | Kubota | H01L 23/047 361/301.3 |
| 2013/0128489 A1* | 5/2013 | Satake | H01L 23/057 361/820 |
| 2014/0008780 A1* | 1/2014 | Tsujino | H01L 23/057 257/690 |
| 2017/0069556 A1 | 3/2017 | Kawazu | |

FOREIGN PATENT DOCUMENTS

| | | |
|---|---|---|
| JP | 2015-015513 A | 1/2015 |
| WO | 2015/137489 A1 | 9/2015 |

* cited by examiner

SEMICONDUCTOR ELEMENT PACKAGE, SEMICONDUCTOR DEVICE, AND MOUNTING STRUCTURE

TECHNICAL FIELD

The present invention relates to a semiconductor element package that houses a semiconductor element, a semiconductor device, and a mounting structure.

BACKGROUND ART

An optical semiconductor element, such as a light emitting element and a light receiving element, and a semiconductor element, such as a signal processing computing element, are housed in a semiconductor element package that protects semiconductor elements and connects the semiconductor elements and external wiring.

In a package described in JP H11-214556 A, a plurality of line conductors are formed substantially parallel to one another on an upper surface of a dielectric substrate. A groove having a width of greater than or equal to 0.2 mm and a depth of greater than or equal to ½ of a thickness of the dielectric substrate is provided in the dielectric substrate between the line conductors. Air that intervenes in this groove reduces a capacitance value between the line conductors and reduces electrical interference.

The package described in JP H11-214556 A has a configuration without a dielectric between end portions of the line conductors at an end portion of the dielectric substrate by providing the groove. The reduction in the capacitance value between the line conductors reduces electromagnetic interference. This suppresses adverse effects on signal characteristics. However, if the end portions of the line conductors are weakly coupled together, each of the end portions of the line conductors is coupled to an unspecified conductor such as a line conductor and a ground conductor provided on an external wiring substrate connected to the ground conductor and the line conductor in the vicinity. As a result, an electromagnetic field at the end portions of the line conductors is disturbed. This leads to various failures including an increase in loss due to reflection and penetration and occurrence of electromagnetic interference. This may degrade transmission characteristics of signals transmitted through the line conductors.

A semiconductor element package according to one aspect of the present invention includes a base body, a frame member, and a terminal member. The base body has a plate shape and includes a main surface including a mount region in which a semiconductor element is mounted. The frame member is a rectangular frame member provided on the main surface of the base body so as to surround the mount region and has a notch that penetrates the frame member in a thickness direction between an inner peripheral surface and an outer peripheral surface and that is cut out. The terminal member is bonded to the frame member to cover the notch. The terminal member includes a first dielectric layer, a first wiring conductor, a second wiring conductor, and a second dielectric layer. The first wiring conductor is provided on one surface of the first dielectric layer, has a first end portion electrically connected to the semiconductor element, and has a second end portion electrically connected to external wiring. The second wiring conductor is provided on the one surface of the first dielectric layer on which the first wiring conductor is provided, has a third end portion electrically connected to the semiconductor element, has a fourth end portion electrically connected to the external wiring, and is disposed at an interval between the first wiring conductor and the second wiring conductor. The second dielectric layer covers a central portion of the first wiring conductor and a central portion of the second wiring conductor such that the first end portion and the second end portion of the first wiring conductor as well as the third end portion and the fourth end portion of the second wiring conductor are exposed. The first dielectric layer has a hole provided open in a region of the one surface between the first wiring conductor and the second wiring conductor.

A semiconductor device according to one aspect of the present invention includes the semiconductor element package described above and a semiconductor element mounted in a mount region.

A mounting structure according to one aspect of the present invention includes the semiconductor device described above and an external wiring substrate. The external wiring substrate includes a dielectric substrate, external wiring, and a ground conductor layer. The external wiring is provided on a first surface of the dielectric substrate and electrically connected to the first end portion and the third end portion. The ground conductor layer is provided on a second surface of the dielectric substrate.

DESCRIPTION OF EMBODIMENTS

Figure 1:
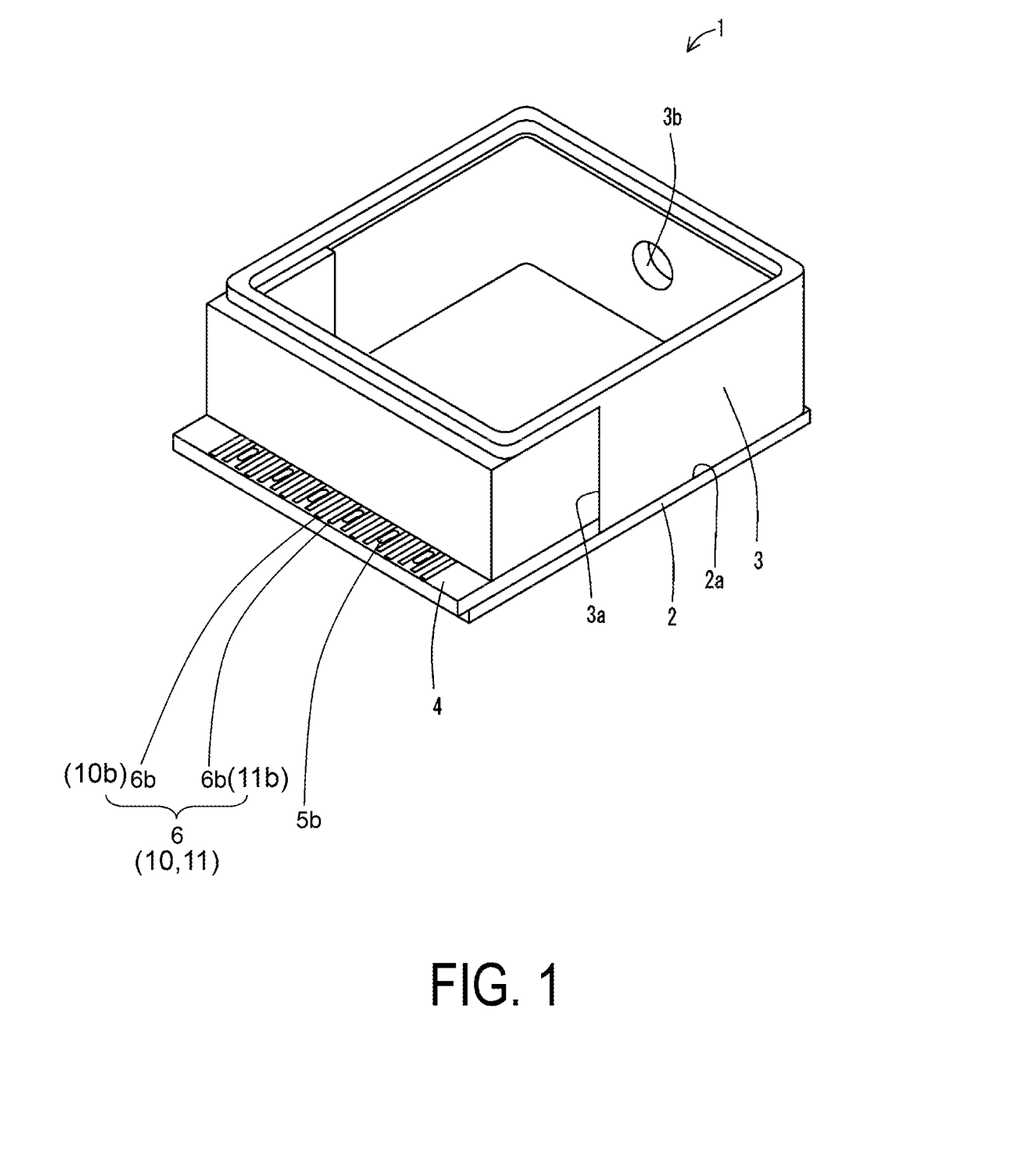
FIG. 1 is a perspective view illustrating a configuration of a semiconductor element package 1 according to a first embodiment of the present invention.
Figure 2:
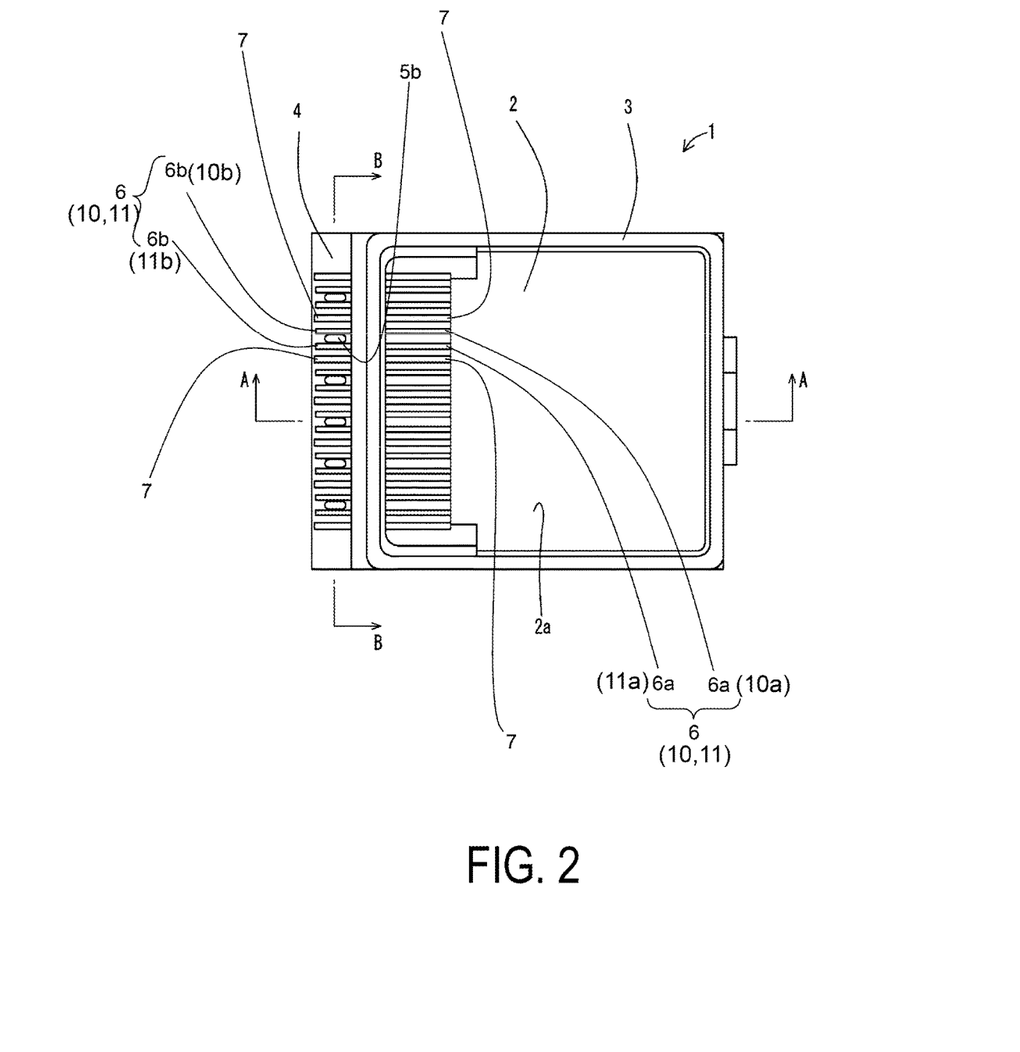
FIG. 2 is a plan view of the semiconductor element package 1.
Figure 3A:
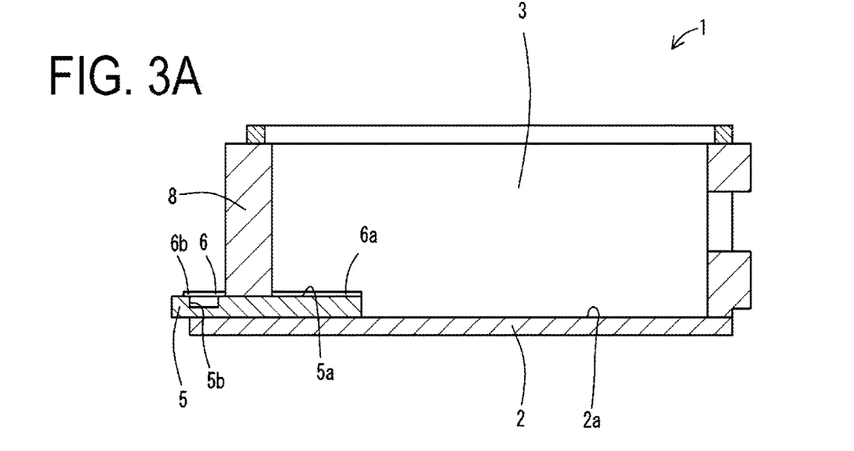
FIGS. 3A and 3B are cross-sectional views of the semiconductor element package 1.
Figure 3B:
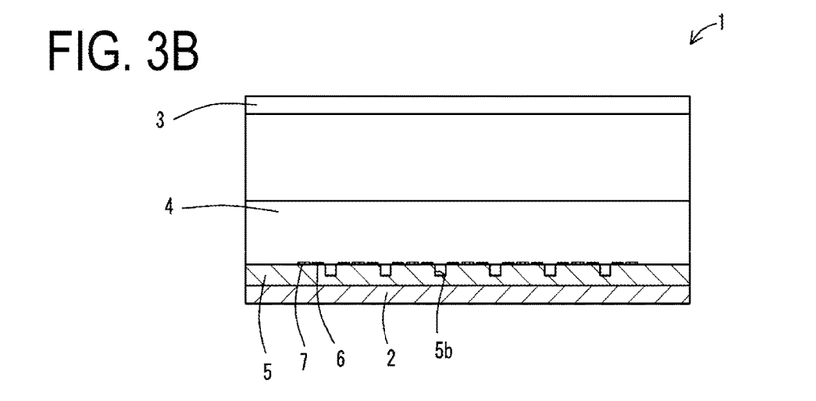

FIG. 1 is a perspective view illustrating a configuration of a semiconductor element package 1 according to a first embodiment of the present invention. FIG. 2 is a plan view when the semiconductor element package 1 is viewed from above a main surface 2a of a base body 2. FIGS. 3A and 3B are cross-sectional views of the semiconductor element package 1. FIG. 3A is a cross-sectional view taken along a cross-sectional line A-A in FIG. 1. FIG. 3B is a cross-sectional view taken along a cross-sectional line B-B in FIG. 1.

The semiconductor element package 1 includes the base body 2, a frame member 3, and a terminal member 4. The frame member 3 is provided on the main surface 2a of the base body 2. A notch 3a is formed on the base body 2 side of this frame member 3. The notch 3a is a gap between the main surface 2a of the base body 2 and the frame member 3. The terminal member 4 is provided so as to cover the notch 3a as the gap.

In this embodiment, a semiconductor element housed in the semiconductor element package 1 is an optical semiconductor element such as a light emitting element and a light receiving element. As long as the semiconductor element can be housed in the semiconductor element package 1 that includes the base body 2, the frame member 3, and the terminal member 4, the semiconductor element may be other semiconductor elements such as a sensor element and an imaging element.

The base body 2 is formed in a rectangular plate shape and includes a mount region in the main surface 2a on which a semiconductor can be mounted. This mount region is a region for allowing the semiconductor element housed in the semiconductor element package 1 to be mounted thereon and allowing the semiconductor element to be fixed on a surface of the base body 2.

The base body 2 in the present embodiment is manufactured by laminating a plurality of insulating substrates. Then, the semiconductor element is mounted in the mount region of the base body 2. A ceramic material, such as an aluminum oxide sintered body, a mullite sintered body, a silicon carbide sintered body, an aluminum nitride sintered body, and a silicon nitride sintered body, or a glass ceramic material may be used as the insulating substrate.

An example of a method for manufacturing the base body 2 is described. Raw material powder that contains glass powder and ceramic powder of the above-mentioned materials, an organic solvent, and a binder are mixed to produce a mixture member. By molding this mixture member into a sheet shape, a plurality of ceramic green sheets are manufactured. The plurality of manufactured ceramic green sheets are laminated to manufacture a laminated body. The laminated body is fired at a temperature of approximately 1600 degrees to manufacture the base body 2.

Note that the base body 2 is not limited to the configuration in which the plurality of insulating substrates are laminated. The base body 2 may be formed by one insulating substrate. In addition, the base body 2 is required to have high insulating properties at least in a portion of the mount region in which the semiconductor element is mounted. Thus, the base body 2 may have a configuration in which the insulating substrates are laminated on at least the mount region of a metal substrate, for example. Particularly, when the base body 2 is required to have high heat radiating properties, the base body 2 may have such a configuration because the metal member has high heat radiating properties. The configuration in which the insulating substrates are laminated on the metal substrate can increase heat radiating properties of the base body 2.

Specifically, metal, such as iron, copper, nickel, chromium, cobalt, molybdenum, and tungsten, or an alloy of these metals, such as a copper-tungsten alloy, a copper-molybdenum alloy, and an iron-nickel-cobalt alloy, may be used as a material for the metal substrate. The metal substrate forming the base body 2 can be manufactured by performing a metal working method, such as a rolling processing method and a punching processing method, on an ingot of such a metal material.

The insulating substrates separately manufactured are bonded to the mount region of the manufactured metal substrate with a bonding material such as a brazing material, to thereby obtain the base body 2.

The frame member 3 is formed of a rectangular frame body and provided on the main surface 2a of the base body 2 so as to surround the mount region in a plan view. As long as the frame member 3 surrounds the mount region, the mount region may be located in a central portion or other portions inside the frame member 3. The base body 2 may have almost the same profile shape as that of the frame member 3. The main surface of the base body 2 may be larger than the frame member 3 or may have an extending portion.

Because the optical semiconductor element is used in the present embodiment, the frame member 3 has a through hole 3b for allowing an optical fiber to be fixed and an optical signal to be input and output. The frame member 3 has the notch 3a that penetrates the frame member 3 in a thickness direction between an inner peripheral surface and an outer peripheral surface and that is cut out.

The terminal member 4 is provided in the notch 3a of the frame member 3 so as to cover the notch 3a. The terminal member 4 is a member for electrically connecting the semiconductor element, which is mounted in the mount region and housed in the semiconductor element package 1, and external wiring. For example, the external wiring is wiring provided on a printed circuit board on which the semiconductor element package 1 is further mounted, wiring provided on a flexible substrate connected to the terminal member 4 of the semiconductor element package 1, or the like. The external wiring is wiring that needs to be electrically connected to the semiconductor element outside the semiconductor element package 1.

The terminal member 4 includes a first dielectric layer 5, a plurality of signal wiring conductors 6 and a plurality of coplanar ground conductor layers 7 that are provided on one surface of the first dielectric layer 5, and a second dielectric layer 8.

The first dielectric layer 5 is made from a ceramic material that is a dielectric material, for example. The plurality of signal wiring conductors 6 and the plurality of coplanar ground conductor layers 7 are provided on the one surface of the first dielectric layer 5. The signal wiring conductors 6 each include one end portion 6a that is electrically connected to the semiconductor element housed in the semiconductor element package 1, and include the other end portion 6b that is electrically connected to the external wiring.

The first dielectric layer 5 preferably includes a layer-shaped or plate-shaped portion having one flat surface 5a on which the plurality of signal wiring conductors 6 and the plurality of coplanar ground conductor layers 7 are provided. The whole shape of the first dielectric layer 5 is formed such that the base body 2 side of the notch 3a of the frame member 3 is covered.

The coplanar ground conductor layers 7 are disposed on both sides of a pair of the signal wiring conductors 6 at a fixed interval between the signal wiring conductor 6 and the coplanar ground conductor layer 7.

The pair of signal wiring conductors 6 may each transmit an independent separate signal, or may be a differential signal wiring pair that each transmit a signal in opposite phase to each other. The differential signal wiring pair have high noise-resistant properties and are suitable for transmitting high-frequency signals. In the present embodiment, one of the pair of signal wiring conductors 6 is a first wiring conductor 10 and the other signal wiring conductor 6 is a second wiring conductor 11.

The signal wiring conductor 6 has a conductor width of 0.1 mm to 1 mm, for example. The signal wiring conductor 6 has a wiring pitch of 0.3 to 3 mm, for example. The signal wiring conductor 6 and the coplanar ground conductor layer 7 have an interval of, for example, 0.1 mm to 1 mm therebetween. The size of the coplanar ground conductor layer 7 can be appropriately determined on the basis of the conductor width and the wiring pitch of the signal wiring conductor 6 and the interval between the signal wiring conductor 6 and the coplanar ground conductor layer 7.

The second dielectric layer 8 is provided so as to cover the central portions of the signal wiring conductors 6 and the coplanar ground conductor layers 7 such that the one end portion 6a and the other end portion 6b of the pair of signal wiring conductors 6 are exposed. In the present embodiment, the one end portion 6a of one of the signal wiring conductors 6, which is the first wiring conductor 10, is a first end portion 10a and the other end portion 6b thereof is a second end portion 10b. The one end portion 6a of the other signal wiring conductor 6, which is the second wiring conductor 11, is a third end portion 11a and the other end portion 6b thereof is a fourth end portion 11b.

For example, the second dielectric layer 8 is made from a ceramic material, for example, that is a dielectric material similarly to the first dielectric layer 5. The second dielectric layer 8 preferably includes a layer-shaped or plate-shaped portion having a main surface facing the surface of the first dielectric layer on which the signal wiring conductors 6 and the coplanar ground conductor layers 7 are provided, another main surface opposite to the first main surface and on which a main surface ground conductor layer 12, which will be described below, is provided, and two side surfaces orthogonal to a first direction in which the signal wiring conductors 6 extend.

The second dielectric layer 8 has a thickness of 1 mm to 10 mm, for example, and a width of 5 mm to 15 mm, for example. The second dielectric layer 8 may have a length that covers all the signal wiring conductors 6.

The first dielectric layer 5 has a hole 5b provided open in a region of the one surface 5a between the first wiring conductor 10 and the second wiring conductor 11. The hole 5b is provided without overlapping both of the first wiring conductor 10 and the second wiring conductor 11 in the plan view. In other words, the hole 5b may be provided in the first dielectric layer 5 such that its opening is located between both sides of the first wiring conductor 10 and the second wiring conductor 11 facing each other. The hole 5b may be provided in the first dielectric layer 5 such that its opening is located at an interval between the hole 5b and the both sides of the first wiring conductor 10, the second wiring conductor 11 facing each other. The intervals from the signal wiring conductors 6, which are the first wiring conductor 10 and the second wiring conductor 11, to the opening may be the same or different from each other. As a result, the terminal member 4 can achieve a desired value of a characteristic impedance at a portion where the first wiring conductors 10 and the second wiring conductors 11 are electrically connected to line conductors provided in the external wiring substrate.

A plurality of holes 5b may be provided along a direction in which one of the signal wiring conductors 6 as the first wiring conductor 10 or the other signal wiring conductor 6 as the second wiring conductor 11 extends. Among the plurality of holes 5b, the hole 5b on the side of the one end portion 6a as the first end portion 10a or the other end portion 6b as the second end portion 10b may have an opening diameter smaller than an opening diameter of the hole 5b on the central portion side of the one surface 5a in the direction in which the signal wiring conductors 6 extend.

Among the plurality of holes 5b, a part or the whole of the hole 5b on the central portion side of the one surface 5a in the direction in which the signal wiring conductors 6 extend may be provided so as to overlap the second dielectric layer 8 in the plan view. The opening diameter and positions of the plurality of holes 5b may have the above-described characteristics in combination. As a result, the terminal member 4 can achieve a desired value of the characteristic impedance of the signal wiring conductors 6.

The hole 5b may have any depth as long as the hole 5b does not penetrate the first dielectric layer 5. For example, the hole 5b has from 10% to 90% of the thickness of the first dielectric layer 5 as a reference.

The opening may have any shape in the plan view. For example, the opening preferably has a circular shape including a perfect circle and an ellipse, a track shape (long hole shape), a polygonal shape, or the like. The opening may have a shape including a part of a perfect circle or an ellipse at an end portion of a track shape (long hole shape) for the purpose of preventing local concentration of stress generated around the hole 5b.

In the present embodiment, the holes 5b have a uniform cross-sectional shape orthogonal to a depth direction. In other words, the shape of the holes 5b is a pillar shape with the opening shape as the bottom shape.

As in the present embodiment, the holes 5b are provided between the first wiring conductors 10 and the second wiring conductors 11, and thus air fills in the portions of the holes 5b. Because a relative dielectric constant of air is almost 1, electric field coupling between the first wiring conductor 10 and the second wiring conductor 11 is weaker than a case where a dielectric material having no hole 5b is provided.

When the electric field coupling between the first wiring conductor 10 and the second wiring conductor 11 becomes weak, an influence of signals transmitted through the first wiring conductors 10 on signals transmitted through the second wiring conductors 11 can be reduced. Accordingly, adverse effects due to electromagnetic interference such as so-called cross talk noise can be suppressed. Also, high-density wiring of the signal wiring conductors 6 and reduced size of the terminal member 4 can be achieved because the interval between the first wiring conductor 10 and the second wiring conductor 11 can be reduced. Furthermore, the dielectric material forming the first dielectric layer 5 is located between the first wiring conductor 10 and the second wiring conductor 11 at the end portions of the pair of signal wiring conductors 6. Accordingly, electric field coupling increases locally at the end portions between the first wiring conductor 10, the second wiring conductor 11, and an inner layer ground conductor layer provided inside the first dielectric layer 5, and the other plane ground conductor layer provided on the other surface of the first dielectric layer 5 facing the one surface 5a. This can achieve to suppress a spread of electric field distribution needed for improving high-frequency properties.

At the other end portions 6b of the signal wiring conductors 6, the line conductor and the ground conductor provided on the external wiring substrate connected to the signal wiring conductors 6, a conductive bonding material (solder) that electrically connects the signal wiring conductors 6 to the line conductors and connects the coplanar ground conductor layers 7 to the ground conductors and fixes them together, and a bonding material for increasing bonding strength between the external wiring substrate and the semiconductor element package 1 are located. Thus, displacement of the external wiring substrate and a thickness and the amount of the conductive bonding material cause an unstable electromagnetic field at the other end portions 6b of the signal wiring conductors 6. The electromagnetic field is generated by high-frequency signals transmitted through the connecting portion between the signal wiring conductors 6 and the line conductors on the external wiring substrate. It is difficult for the electrical field distribution generated between the above-mentioned conductors via a surrounding air layer and the dielectric layer to be a desired distribution. Thus, the characteristic impedance fluctuates at the connecting portion between the signal wiring conductors 6 and the line conductors on the external wiring substrate. This leads to various failures including an increase in loss due to reflection and penetration and occurrence of electromagnetic interference such as cross talk. Furthermore, if a groove is provided between the pair of signal wiring conductors as in the conventional technology, an electromagnetic field is easily coupled with the line conductors and the ground conductors, the conductive bonding material (solder), and the bonding material via the air layer. The electromagnetic field is generated by the high-frequency signals transmitted through one of the signal wiring conductors 6 and the other signal wiring conductor 6. The line conductors and the ground conductors are provided on the external wiring substrate. The conductive bonding material electrically connects the external wiring substrate to the signal wiring conductors 6 and the coplanar ground conductor layers 7 and fixes them together. The bonding material increases the bonding strength between the external wiring substrate and the semiconductor element package 1. The air layer is disposed in the above-mentioned groove and has a dielectric constant smaller than that of the first dielectric layer 5. This causes unspecific electric field coupling at the end portions and unstable characteristic impedance at the connecting portion between the signal wiring conductors 6 and the line conductors on the external wiring substrate. This leads to various failures including an increase in loss due to reflection and penetration and occurrence of electromagnetic interference such as cross talk, which degrades signal transmission characteristics.

As described above, the hole 5b is provided instead of the groove in the present embodiment. This strengthens the electric field coupling locally at the other end portions 6b of the signal wiring conductors 6 between the pair of signal wiring conductors 6, the coplanar ground conductor layer 7 and the inner layer ground conductor layer, which is provided inside the first dielectric layer 5, or the other surface ground conductor layer, which is provided on the other surface of the first dielectric layer 5 facing the one surface 5a. This can reduce the unspecific electromagnetic field coupling with the other conductors. As a result, the disturbance of the electromagnetic field can be suppressed, and the signal transmission characteristics can be improved. At the other end portions 6b of the signal wiring conductors 6, the coupling strengthens between the pair of signal wiring conductors 6, the coplanar ground conductor layer 7 and the inner layer ground conductor layer, which is provided inside the first dielectric layer 5, or the other surface ground conductor layer, which is provided on the other surface of the first dielectric layer 5 facing the one surface 5a. Accordingly, the capacitance increases, and thus the characteristic impedance at the end portions of the signal wiring conductors 6 tends to decrease locally. The characteristic impedance can be adjusted to a desired value by adjusting the interval between the signal wiring conductor 6, the coplanar ground conductor layer 7 and the inner layer ground conductor layer, which is provided inside the first dielectric layer 5, or the other surface ground conductor layer, which is provided on the other surface of the first dielectric layer 5 facing the one surface 5a. Furthermore, electromagnetic interference such as cross talk generated between the pair of signal wiring conductors 6 can be suppressed by reducing the unspecific coupling with the other conductors.

A distance from an end face of the first dielectric layer 5 to the opening of the hole 5b (corresponding to size of a portion where the dielectric material is locally provided) is from 0.2 mm to 2 mm, for example.

In the present embodiment, if the groove is provided in the first dielectric layer 5 in advance, this groove at the end portion may be locally filled with a dielectric material to form the hole 5b. The dielectric material that fills the groove may be the same dielectric material forming the first dielectric layer 5 or may be different.

The terminal member 4 includes the first dielectric layer 5, the signal wiring conductors 6, the coplanar ground conductor layers 7, and the second dielectric layer 8 described above. The terminal member 4 has the overall shape so as to cover the notch 3a of the frame member 3. The inner layer ground conductor layer described above is provided inside the terminal member 4. Alternatively, the other surface ground conductor described above is provided on the other surface of the first dielectric layer 5 facing the one surface 5a.

The first dielectric layer 5 and the second dielectric layer 8 are made from the same ceramic material as that for the above-described insulating substrates of the base body 2. The signal wiring conductors 6 and the coplanar ground conductor layers 7 are made from a metal material such as gold, silver, copper, nickel, tungsten, molybdenum, and manganese. The signal wiring conductors 6 and the coplanar ground conductor layers 7 may be formed by simultaneously firing the metal material in such a manner as a metalized layer or a plating layer in a surface layer or an inner layer of the dielectric layers, or may be formed by metal plating. A line material made from a metal material may be processed into a predetermined shape, manufactured, and connected as a lead terminal to the signal wiring conductors 6 by bonding through a bonding material such as a brazing material. For example, a material is not limited to the metal material that can be simultaneously fired with each of the dielectric layers. A metal alloy made of iron, nickel, cobalt, chromium, or the like that is processed into a predetermined shape as a lead terminal and bonded may also be used.

Each of the dielectric layers is manufactured as follows if made of an aluminum oxide-based sintered body, for example. First, raw material powder such as aluminum oxide and silicon oxide together with an appropriate organic binder and an appropriate organic solvent are molded into a sheet shape, to thereby manufacture a plurality of ceramic green sheets having a rectangular sheet shape. Each of the ceramic green sheets is processed into a predetermined profile shape by punching or the like. Holes corresponding to the holes 5b are provided in the ceramic green sheets. These ceramic green sheets are then laminated to manufacture a laminated body. Subsequently, this laminated body is fired at a temperature of 1300 to 1600° C., so that each of the dielectric layers can be manufactured. Note that the plurality of ceramic green sheets do not necessarily have to be laminated. Only one layer of the ceramic green sheet may be enough as long as there is no problem with mechanical strength to serve as each of the dielectric layers.

If each of the dielectric layers is made of an aluminum oxide-based sintered body, the signal wiring conductor or the ground conductor layer may contain tungsten, for example, and can be manufactured as follows. A metal paste is manufactured by mixing powder of tungsten with an organic solvent and an organic binder. The metal paste is then printed on the front surface (main surface) of the ceramic green sheets that serve as the dielectric layer so as to have a predetermined pattern shape by a method such as a screen printing method. Subsequently, the signal wiring conductor or the ground conductor layer can be formed by a method for simultaneously firing these ceramic green sheets and the metal paste.

Figure 4A:
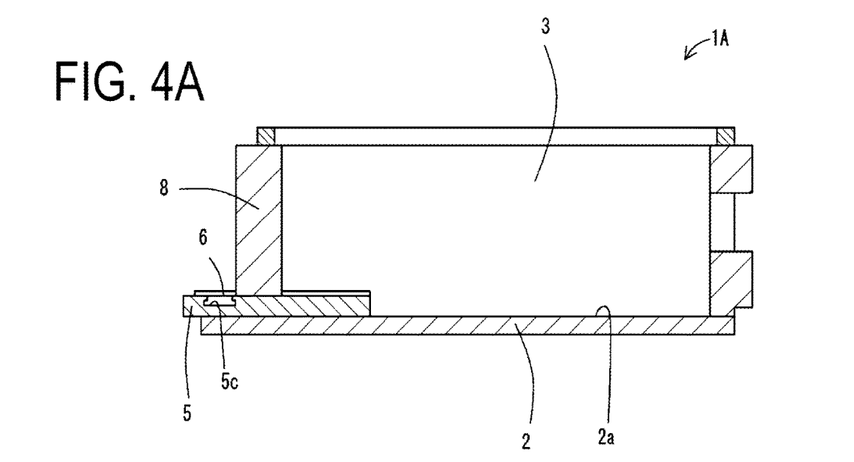
FIGS. 4A and 4B are cross-sectional views of a semiconductor element package 1A according to a second embodiment of the present invention.
Figure 4B:
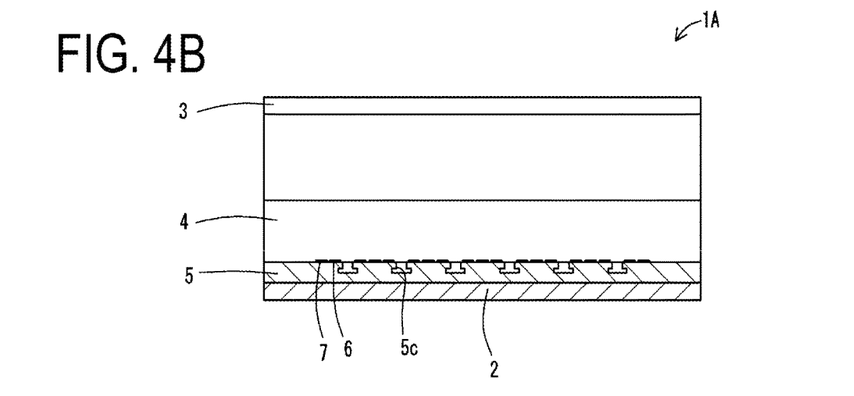

Next, a second embodiment of the present invention is described. FIGS. 4A and 4B is a cross-sectional view of a semiconductor element package 1A according to the second embodiment of the present invention. FIG. 4A is a cross-sectional view corresponding to FIG. 3A. FIG. 4B is a cross-sectional view corresponding to FIG. 3B. The semiconductor element package 1A according to the second embodiment differs from the semiconductor element package 1 according to the first embodiment only in a shape of holes 5c. The other configurations are the same as those of the semiconductor element package 1. Accordingly, the same configurations are denoted by the same references, and detailed description will be omitted.

The hole 5c in the present embodiment has different hole diameters in the depth direction of the first dielectric layer 5. The hole diameter on the bottom side is larger than the hole diameter on the opening side. In the present invention, as described above, providing a hole has the effect of reducing the electric field coupling between the first wiring conductor 10, the second wiring conductor 11, the coplanar ground conductor layer 7 and the inner layer ground conductor layer, which is provided inside the first dielectric layer 5, or the other surface ground conductor layer, which is provided on the other surface of the first dielectric layer 5 facing the one surface 5a. Thus, the effect increases with the larger hole. However, the hole diameter on the opening side is limited by a size of the region between the first wiring conductor 10 and the second wiring conductor 11 and cannot be larger than the region. The hole diameter on the bottom side is not limited in such a manner and can thus be further increased. In the plan view, the hole 5c on the bottom side may be provided so as to overlap the first wiring conductor 10 and the second wiring conductor 11.

The hole diameter on the bottom side larger than the hole diameter on the opening side can further reduce the electric field coupling between the first wiring conductor 10, the second wiring conductor 11, the coplanar ground conductor layer 7 and the inner layer ground conductor layer, which is provided inside the first dielectric layer 5, or the other surface ground conductor layer, which is provided on the other surface of the first dielectric layer 5 facing the one surface 5a. Thus, adverse effects due to electromagnetic interference between the pair of signal wiring conductors 6 can be further suppressed. Also, the characteristic impedance of the signal wiring conductors 6 can be adjusted to a desired value while reducing the interval between the pair of signal wiring conductors 6 by freely adjusting the hole diameter on the bottom side. In other words, reduced size of the semiconductor element package 1 or high density of the signal wiring conductors 6 can be achieved. The hole on the opening side and the hole on the bottom side may have a similar shape and may be symmetrical about a central line of the hole 5c in the direction in which the signal wiring conductors 6 extend in the plan view. This leads to a uniform capacitance between the pair of signal wiring conductors 6, the coplanar ground conductor layer 7 and the inner layer ground conductor layer, which is provided inside the first dielectric layer 5, or the other surface ground conductor layer, which is provided on the other surface of the first dielectric layer 5 facing the one surface 5a, along the direction in which the signal wiring conductors 6 extend. Thus, the signal wiring conductors 6 have a fixed characteristic impedance, and an insertion loss and a return loss caused when high-frequency signals are transmitted through the signal wiring conductors 6 can be suppressed.

If the hole diameter on the bottom side is larger than the hole diameter on the opening side, the adverse effects due to electromagnetic interference can be further suppressed in comparison to the case where the hole diameters on the bottom side and on the opening side are the same. In this way, the hole diameter on the bottom side can be larger without limit, and is preferably 1.1 to 2 times as large as the hole diameter on the opening side.

The first dielectric layer 5 in the present embodiment having the holes 5c that have different hole diameters in the depth direction can be manufactured by laminating three layers of the ceramic green sheets, for example. Holes are not formed in the lower green sheet because the lower green sheet serves as a bottom portion. The green sheet in the middle layer has large-diameter holes formed therein. The upper green sheet has small-diameter holes concentric with the holes of the middle green sheet. These layers can be then laminated and fired.

Figure 5A:
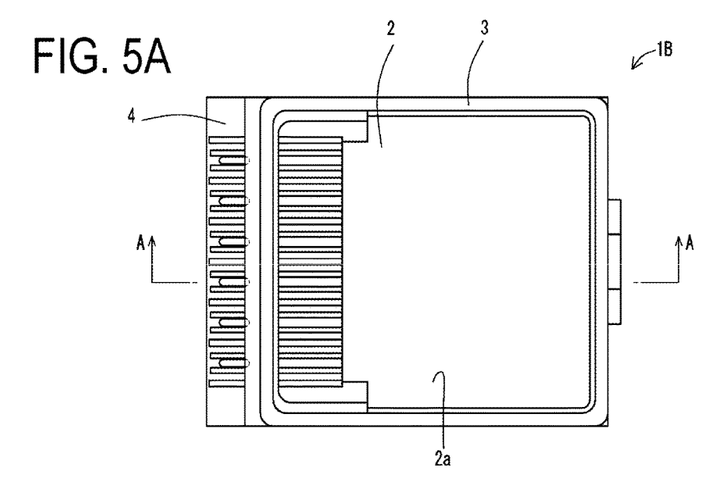
FIGS. 5A and 5B are cross-sectional views of a semiconductor element package 1B according to a third embodiment of the present invention.
Figure 5B:
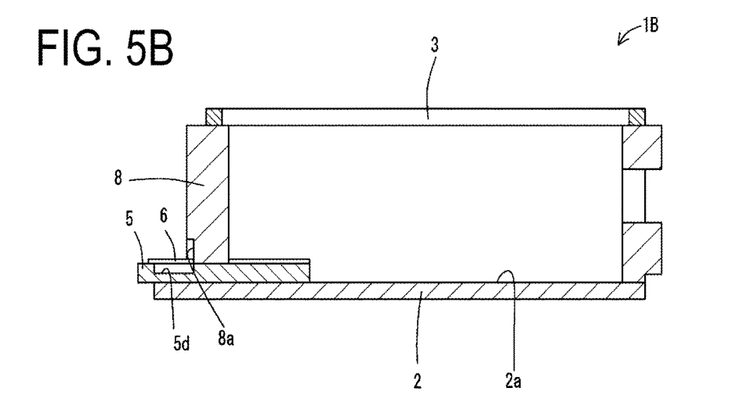

Next, a third embodiment of the present invention is described. FIGS. 5A and 5B are cross-sectional views of a semiconductor element package 1B according to the third embodiment of the present invention. FIG. 5A is a cross-sectional view corresponding to FIG. 3A. FIG. 5B is a cross-sectional view corresponding to FIG. 3B. The semiconductor element package 1B according to the third embodiment differs from the semiconductor element package 1 according to the first embodiment in positions of holes 5d. Only at least part of the opening of the hole 5d is disposed so as to overlap the second dielectric layer 8 in the plan view while the other configurations are the same as those of the semiconductor element package 1. Accordingly, the same configurations are denoted by the same references, and detailed description will be omitted.

At the portion of the signal wiring conductors 6 covered by the second dielectric layer 8, the dielectric is located above the signal wiring conductors 6. Thus, the electric field coupling between the signal wiring conductors 6, the coplanar ground conductor layer 7 and the inner layer ground conductor layer, which is provided inside the first dielectric layer 5, or the other surface ground conductor layer, which is provided on the other surface of the first dielectric layer 5 facing the one surface 5a, is greater at the portion than the other portions. As a result, the characteristic impedance of the signal wiring conductors 6 tends to be smaller at the portion than the other portions. A change in characteristic impedance in transmission lines causes degradation in transmission characteristics such as reflection of signals transmitted through the transmission lines. The characteristic impedance sharply changes especially around the end face of the second dielectric layer 8.

In the present embodiment, at least part of the opening of the hole 5d is disposed so as to overlap the second dielectric layer 8. Thus, the holes 5d in the positions where the holes 5d overlap the second dielectric layer 8 reduce the electric field coupling between the signal wiring conductors 6, the coplanar ground conductor layer 7 and the inner layer ground conductor layer, which is provided inside the first dielectric layer 5, or the other surface ground conductor layer, which is provided on the other surface of the first dielectric layer 5 facing the one surface 5a. This can suppress a reduction in the characteristic impedance especially around the end face of the second dielectric layer 8 and can suppress degradation in the transmission characteristics of the high-frequency signals.

A recessed surface 8a is provided at the portion of the end face of the second dielectric layer 8 that overlaps the holes 5d in the plan view. Accordingly, the interval between the pair of signal wiring conductors 6 is reduced by freely adjusting a height and a width of the recessed surface 8a. A reduction in the characteristic impedance of the signal wiring conductors 6 can be suppressed by reducing the electric field coupling between the signal wiring conductors 6, the coplanar ground conductor layer 7 and the inner layer ground conductor layer, which is provided inside the first dielectric layer 5, or the other surface ground conductor layer, which is provided on the other surface of the first dielectric layer 5 facing the one surface 5a. The characteristic impedance of the signal wiring conductors 6 can be adjusted to a desired value. Thus, reduced size of the semiconductor element package 1 or high density of the signal wiring conductors 6 can be achieved while improving the high-frequency transmission characteristics of the semiconductor element package 1.

Figure 6A:
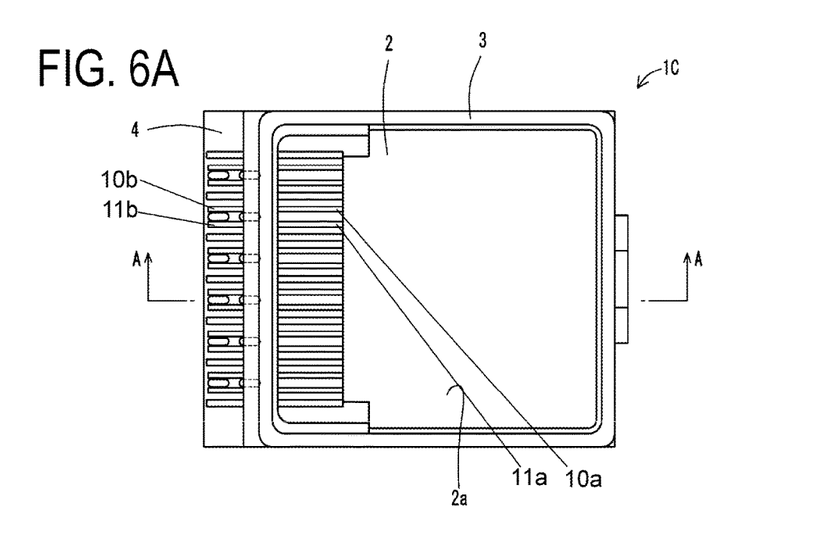
FIGS. 6A and 6B are cross-sectional views of a semiconductor element package 1C according to a fourth embodiment of the present invention.
Figure 6B:
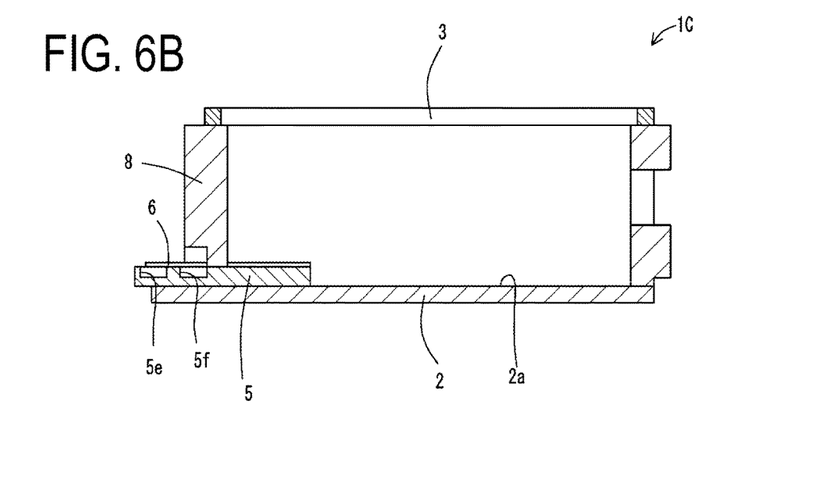

Next, a fourth embodiment of the present invention is described. FIGS. 6A and 6B are cross-sectional views of a semiconductor element package 1C according to the fourth embodiment of the present invention. FIG. 6A is a cross-sectional view corresponding to FIG. 3A. FIG. 6B is a cross-sectional view corresponding to FIG. 3B. The semiconductor element package 1C according to the fourth embodiment differs from the semiconductor element package 1 according to the first embodiment only in that a plurality of holes are provided along the direction in which the signal wiring conductors 6 extend. The other configurations are the same as those of the semiconductor element package 1. Accordingly, the same configurations are denoted by the same references, and detailed description will be omitted.

In the present embodiment, the first dielectric layer 5 has two holes that are a hole 5e and a hole 5f, and may have three or more holes. The hole 5e and the hole 5f in the present embodiment are located only in different positions and have the same size and shape, but at least one of the size and shape may be different. Furthermore, in the plan view, the hole 5e on the end portion side is located so as not to overlap the second dielectric layer 8 while the hole 5f on the central portion side is located so as to overlap the second dielectric layer 8.

As described above, larger holes in the first dielectric layer 5 are better, and the holes preferably have a shape elongated along the direction in which the signal wiring conductors 6 extend. However, if one hole extending from the end portion to the central portion is provided, mechanical strength of the first dielectric layer 5 may decrease. Thus, the plurality of holes may be formed from the end portion to the central portion as in the present embodiment.

Furthermore, the hole 5f of the plurality of holes is located so as to overlap the second dielectric layer 8 in the plan view, so that a reduction in the characteristic impedance can be suppressed similarly to the third embodiment. Thus, the effect of capable of suppressing the degradation in the transmission characteristics can be achieved. Also, as described above, the characteristic impedance of the signal wiring conductors 6 can be adjusted to a desired value while reducing the interval between the pair of signal wiring conductors 6 by freely adjusting a height and a width of the hole 5f. Therefore, reduced size of the semiconductor element package 1 or high density of the signal wiring conductors 6 can be achieved while improving the high-frequency transmission characteristics of the semiconductor element package 1.

Figure 7:
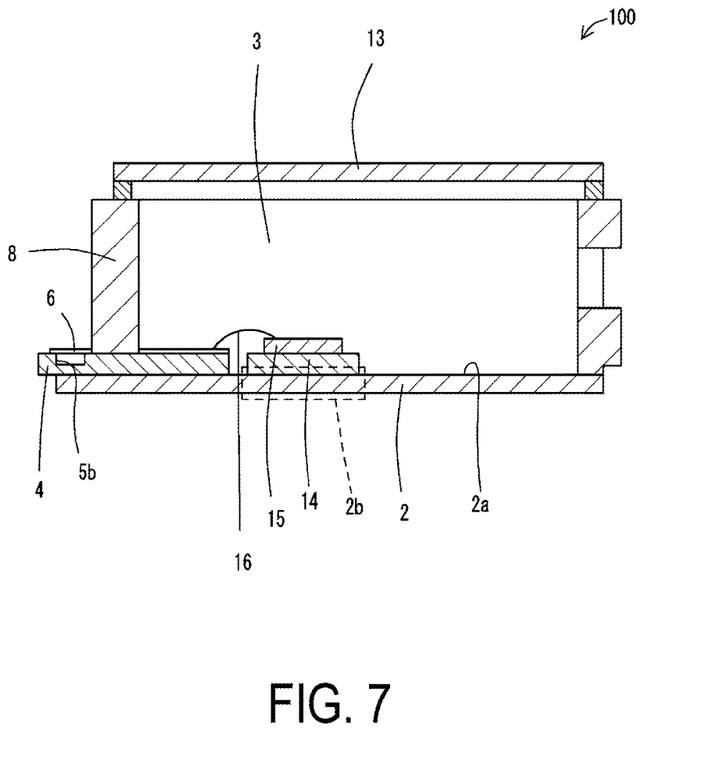
FIG. 7 is a cross-sectional view illustrating a configuration of a semiconductor device 100 according to a fifth embodiment of the present invention.

FIG. 7 is a cross-sectional view illustrating a configuration of a semiconductor device 100 according to a fifth embodiment of the present invention. The semiconductor device 100 includes the semiconductor element package 1, a lid 13 bonded to the frame member 3 opposite to the base body 2, and a semiconductor element 15 mounted in a mount region 2b of the base body 2. The lid 13 is not a necessary configuration in the semiconductor device 100. If other protective members such as sealing resin can protect the semiconductor element 15, the lid 13 does not need to be provided.

The semiconductor device 100 includes the semiconductor element package 1. Accordingly, the semiconductor device that improves signal transmission characteristics can be provided.

As described above, it is preferable that the semiconductor element 15 can be housed in the semiconductor element package 1. In the present embodiment, the semiconductor element 15 is an optical semiconductor element. When the semiconductor device 100 in the present embodiment is used, an optical fiber is connected and fixed to the through hole 3b in the frame member 3. If the optical semiconductor element is a light emitting element such as a laser diode (LD), light is emitted from the light emitting element in response to an electrical signal input from the outside via the signal wiring conductors 6 of the terminal member 4. The emitted light then enters the optical fiber. If the optical semiconductor element is a light receiving element such as a photodiode (PD), light emitted from the optical fiber is radiated to the light receiving element. An electrical signal according to a light receiving amount is then output to the outside via the signal wiring conductors 6 of the terminal member 4.

In this way, if the optical semiconductor element is used as the semiconductor element 15, the semiconductor element 15 needs to be disposed on an optical axis of the optical fiber. Thus, the semiconductor element 15 is preferably mounted on the base body 2 through a Peltier element or a mount member 14 without being directly mounted on the base body 2. The mount member 14 is preferably made from a material having insulating properties. The same ceramic material as that for the above-described insulating substrates of the base body 2 can be used.

In the present embodiment, a connection pad of the semiconductor element 15 and the one end portion 6a of the signal wiring conductor 6 are electrically connected to each other with a bonding wire 16. This allows an electrical signal to be input and output between the semiconductor element 15 and external wiring.

The semiconductor element 15 and the signal wiring conductor 6 of the terminal member 4 can be connected to each other in any manners as long as an electrical signal can be transmitted. In addition to the connection with the bonding wire 16 as in the present embodiment, flip chip connection or connection with an anisotropic conductive film (ACF) may be used. For the connection between the semiconductor element 15 and the signal wiring conductor 6 of the terminal member 4, the semiconductor element 15 may be electrically connected to a wiring conductor provided on the mount member 14, and the one end portion 6a and the wiring conductor may be electrically connected to each other with the bonding wire 16.

As long as the lid 13 can suppress entry of moisture and fine particles into the semiconductor device 100, the same metal material as that for the frame member 3 and the same ceramic material as that for each of the dielectric layers of the terminal member 4 can be used by being processed and molded into a plate shape.

If the semiconductor element 15 is the optical semiconductor element such as LD and PD as in the present embodiment, the lid 13 is opaque that makes light difficult to pass through the lid 13 in order to suppress entry of external light into the semiconductor device 100.

The lid 13 is fixed to an upper portion of the frame member 3 by seam welding or with a bonding material. For example, a brazing material is used as the bonding material. When the semiconductor device 100 is assembled, the semiconductor element package 1 is prepared in advance, and the semiconductor element 15 is mounted in the mount region 2b of the base body 2 and fixed to the base body 2. Subsequently, the semiconductor element 15 and the signal wiring conductor 6 of the terminal member 4 are electrically connected to each other with the bonding wire 16. Also, the optical fiber is fixed to the through hole 3b such that an optical signal is input and output between the semiconductor element 15 and the optical fiber. After that, the lid 13 is fixed to the frame member 3.

Figure 8:
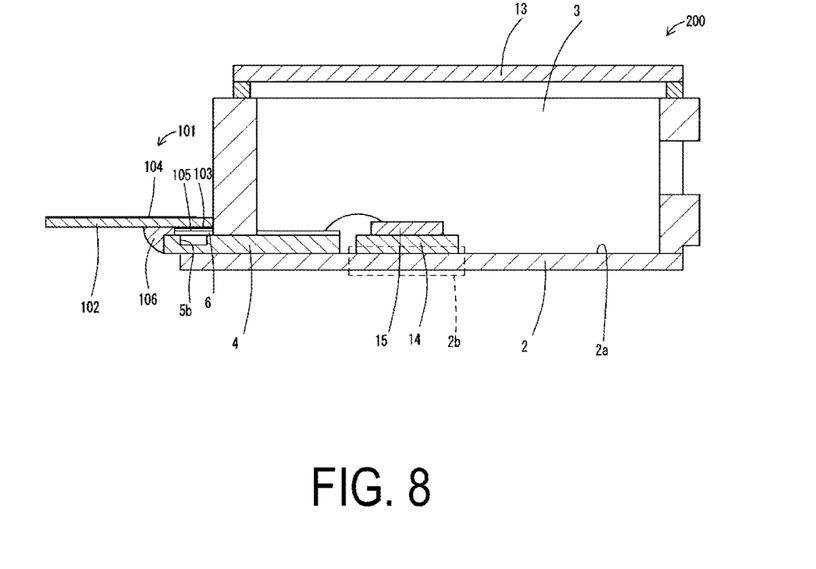
FIG. 8 is a cross-sectional view illustrating a configuration of a mounting structure 200 according to a sixth embodiment of the present invention.

FIG. 8 is a cross-sectional view illustrating a configuration of a mounting structure 200 according to a sixth embodiment of the present invention. The mounting structure 200 includes the semiconductor device 100 according to the fifth embodiment and an external wiring substrate 101. The external wiring substrate 101 includes a dielectric substrate 102, external wiring 103 provided on a first surface of the dielectric substrate 102, and a ground conductor layer 104 provided on a second surface of the dielectric substrate 102. The external wiring 103 is electrically connected to the other end portion 6b of the signal wiring conductor 6.

The dielectric substrate 102 may be made from the same ceramic material as that for the first dielectric layer 5 and the second dielectric layer 8. The dielectric substrate 102 may be made from a resin material. Examples of the resin material include an epoxy resin, a polyimide resin, an acrylic resin, a phenol resin, a fluorine-based resin, and the like.

In the present embodiment, the dielectric substrate 102 is made of polyimide resin, and the external wiring substrate 101 is a so-called flexible wiring substrate. The external wiring 103 and the signal wiring conductor 6 are bonded together such that their surfaces facing each other are bonded together with a conductive bonding material 105 such as solder, for example. Furthermore, bonding of the external wiring 103 and the signal wiring conductor 6 may be insufficient for bonding strength between the external wiring substrate 101 and the terminal member 4. Thus, an adhesive 106 made of epoxy resin, for example, is poured into a corner formed by an end face of the terminal member 4 and the first surface of the dielectric substrate 102 to thereby improve the bonding strength.

Here, if the first dielectric layer 5 has a groove as in a conventional manner, some of the adhesive 106 enters the groove because the groove is open to the end face of the first dielectric layer. The adhesive 106 is a dielectric material. The entry of the adhesive 106 into the groove increases a dielectric constant at the portion in an uncontrollable state. Also, it increases a capacitance in an uncontrollable state while increasing electric field coupling between the signal wiring conductors 6. Accordingly, the characteristic impedance of the signal wiring conductors 6 deviates from a desired value. Moreover, it is difficult for the same amount of the adhesive 106 to enter the same position of each groove, so that the amount and the position of the adhesive 106 vary from one groove to another. This causes a difference in magnitude of electric field coupling for each pair of the signal wiring conductors 6. Thus, the characteristic impedance of the signal wiring conductors 6 varies, so that the signal transmission characteristics vary.

Because the hole is provided instead of the groove in the present embodiment, no adhesive 106 can enter in such a manner. Thus, the variation in signal characteristics for each pair of the signal wiring conductors 6 can be suppressed.

Next, an example of the present invention is described.

In the example of the present invention, the first dielectric layer 5 was an aluminum oxide-based sintered body; the pair of signal wiring conductors 6 had a conductor width of 0.4 mm; the pair of signal wiring conductors 6 had a wiring pitch of 0.6 mm; an interval between the signal wiring conductor 6 and the coplanar ground conductor layer 7 was 0.4 mm; a distance from the end face of the first dielectric layer 5 to the opening of the hole 5b was 0.4 mm; the hole 5d had a depth of 0.3 mm; the hole 5b had a length of 0.9 mm in the direction in which the signal wiring conductors 6 extended; and the hole 5b had a width of 0.2 mm in the vertical direction to the direction in which the signal wiring conductors 6 extended. A comparative example differs from the example only in that a hole is not provided.

Figure 9:
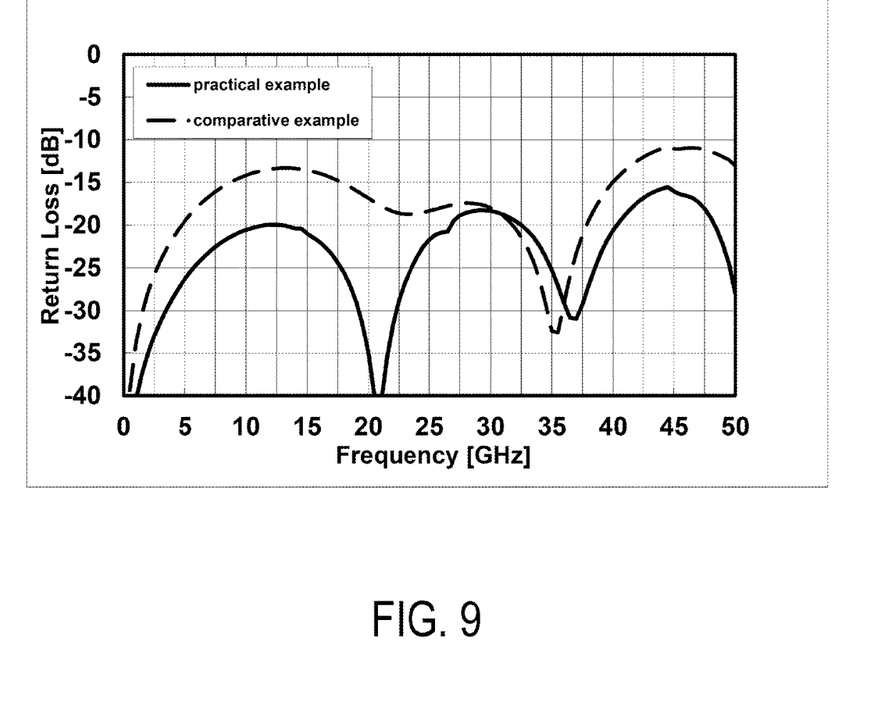
FIG. 9 is a diagram showing simulation results of a return loss.

A return loss in the example and the comparative example was calculated by simulation. FIG. 9 is a diagram showing simulation results of the return loss. A vertical axis of the graph shows the return loss, and a horizontal axis thereof shows a frequency of a transmitted signal. The return loss having a smaller value and a smaller loss is more excellent in transmission characteristics. As clearly seen from FIG. 9, the return loss is smaller in the example than in the comparative example in almost all frequency bands.

REFERENCE SIGNS LIST 1, 1A, 1B, 1C Semiconductor element package
2 Base body
2a Main surface
2b Mount region
3 Frame member
3b Through hole
4 Terminal member
5 First dielectric layer
5a One surface
5b, 5c, 5d, 5e, 5f Hole
6 Signal wiring conductor
6a One end portion
6b The other end portion
7 Coplanar ground conductor layer
8 Second dielectric layer
8a Recessed surface
10 First wiring conductor
10a First end portion
10b Second end portion
11 Second wiring conductor
11a Third end portion
11b Fourth end portion
12 Main surface ground conductor layer
13 Lid
14 Mount member
15 Semiconductor element
16 Bonding wire
100 Semiconductor device
101 External wiring substrate 102 Dielectric substrate
103 External wiring
104 Ground conductor layer
105 Conductive bonding material
106 Adhesive
200 Mounting structure

The invention claimed is:

1. A semiconductor element package, comprising:
a base body that has a plate shape and comprising a main surface comprising a mount region in which a semiconductor element is mounted;
a frame member that is a rectangular frame member located on the main surface of the base body surrounding the mount region and comprising a notch that penetrates the frame member in a thickness direction between an inner peripheral surface and an outer peripheral surface and that is cut out; and
a terminal member that is bonded to the frame member to cover the notch and comprises
a first dielectric layer,
a first wiring conductor located on one surface of the first dielectric layer, comprising a first end portion electrically connected to the semiconductor element, and a second end portion electrically connected to external wiring,
a second wiring conductor located on the one surface of the first dielectric layer on which the first wiring conductor is located, comprising a third end portion electrically connected to the semiconductor element, and a fourth end portion electrically connected to the external wiring, and is disposed at an interval between the first wiring conductor and the second wiring conductor, and
a second dielectric layer that covers a central portion of the first wiring conductor and a central portion of the second wiring conductor that the first end portion and the second end portion of the first wiring conductor as well as the third end portion and the fourth end portion of the second wiring conductor are exposed,
wherein the first dielectric layer comprises a hole located open in a region of the one surface between the first wiring conductor and the second wiring conductor.

2. The semiconductor element package according to claim 1, wherein the hole comprising different hole diameters in a depth direction, and a hole diameter on a bottom side is larger than a hole diameter on an opening side.

3. The semiconductor element package according to claim 2, wherein at least a part of an opening of the hole overlaps the second dielectric layer in a plan view.

4. A semiconductor device, comprising:
the semiconductor element package according to claim 2; and
a semiconductor element mounted in a mount region.

5. The semiconductor element package according to claim 1, wherein at least a part of an opening of the hole overlaps the second dielectric layer in a plan view.

6. A semiconductor device, comprising:
the semiconductor element package according to claim 5; and
a semiconductor element mounted in a mount region.

7. A semiconductor device, comprising:
the semiconductor element package according to claim 1; and
a semiconductor element mounted in a mount region.

8. A mounting structure, comprising:
the semiconductor device according to claim 7; and
an external wiring substrate that comprises
a dielectric substrate,
external wiring that is located on a first surface of the dielectric substrate and electrically connected to the first end portion and the third end portion, and
a ground conductor layer located on a second surface of the dielectric substrate.

* * * * *